(12) United States Patent
Seetharaman et al.

(10) Patent No.: US 6,809,596 B2
(45) Date of Patent: Oct. 26, 2004

(54) DC OFFSET CANCELLATION CIRCUIT, SYSTEM AND METHOD

(75) Inventors: Shivakumar Seetharaman, Westlake Village, CA (US); Kursad Kiziloglu, Los Angeles, CA (US); Cindra W. Abidin, Los Angeles, CA (US); Georgios S. Asmanis, North Hollywood, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/324,983

(22) Filed: Dec. 20, 2002

(65) Prior Publication Data

US 2004/0119539 A1 Jun. 24, 2004

(51) Int. Cl.[7] .................................................. H03F 3/08
(52) U.S. Cl. ........................ 330/308; 330/11; 330/292; 330/301; 330/85; 330/97; 375/318; 250/214 R
(58) Field of Search .......................... 330/308, 11, 290, 330/301, 85, 97; 375/318; 250/214 R; 398/202

(56) References Cited

U.S. PATENT DOCUMENTS

| | | | |
|---|---|---|---|
| 5,430,766 A | * | 7/1995 | Ota et al. .................... 375/318 |
| 5,805,558 A | | 9/1998 | Kimura |
| 5,892,609 A | | 4/1999 | Saruwatari |
| 6,342,694 B1 | | 1/2002 | Satoh |
| 6,593,810 B2 | | 7/2003 | Yoon |
| 2001/0329260 | * | 11/2001 | Chiou et al. ................. 398/202 |

FOREIGN PATENT DOCUMENTS

JP    411145913    *   5/1999

OTHER PUBLICATIONS

MacLeod "On the Bandwidth of Carrier–Type DC Amplifiers" IEEE Transaction on Circuits and Systems vol.: 17, Issue 3, Aug. 1970 pp 367–371.*
U.S. patent application, Ser. No. 10/324,999 entitled "Transimpedance Amplifier", Inventor(s) Shivakumar Seetharaman, et al., (Filed Dec. 20, 2002).
U.S. patent application, Ser. No. 10/325,048 entitled "Transimpedance Amplifier", Inventor(s) Seetharaman, et al., (Filed Dec. 20, 2002).
U.S. patent application, Ser. No. 10/325,026 entitled "Transimpendance Amplifier", Inventor(s) Seetharaman, et al., (Filed Dec. 20, 2002).
IEEE Std. 802.3ae–2002, clauses 46, 47 and 51–53.

* cited by examiner

Primary Examiner—Michael B Shingleton
(74) Attorney, Agent, or Firm—Paul G. Nagy

(57) ABSTRACT

Described are a circuit and system to provide an output signal in response to composite input signal comprising an AC signal component and a DC signal component. An amplifier provides an amplified voltage signal in response to a voltage representative of the composite signal. A filter may provide a filtered voltage signal having a magnitude that is representative of a magnitude of the DC signal component in response to the amplified voltage signal. A DC signal removal circuit may substantially remove at least a portion of the DC signal component from an input terminal in response filtered voltage signal.

26 Claims, 6 Drawing Sheets

DC OFFSET CANCELLATION CIRCUIT, SYSTEM AND METHOD

The subject matter disclosed herein relates to U.S. patent application Ser. No. 10/074,099, filed on Oct. 11, 2001, U.S. patent application Ser. No. 10/074,397, filed on Feb. 11, 2002, and U.S. patent application Ser. Nos. 10/324,999; 10/324,048 and 10/325,026 filed on Dec. 20, 2002.

BACKGROUND

Field

The subject matter disclosed herein relates to data communication systems. In particular, embodiments disclosed herein relate to processing data received from an optical transmission medium.

Information

Optical communication networks have been implemented to enable increased data rates in links providing point to point communication. For example, optical communication links are typically implemented in Synchronous Optical Network/Synchronous Digital Hierarchy (SONET/SDH) and 10 Gigabit Ethernet systems. At a receiving end of such an optical communication link, a photodiode may generate a current in response an optical signal received from an optical transmission medium (e.g., fiber optical cabling). A transimpedance amplifier (TIA) typically converts the current generated by the photodiode into a voltage signal that is then processed. For example, the voltage signal may be processed by clock and data recovery circuitry to recover data transmitted in the optical signal.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
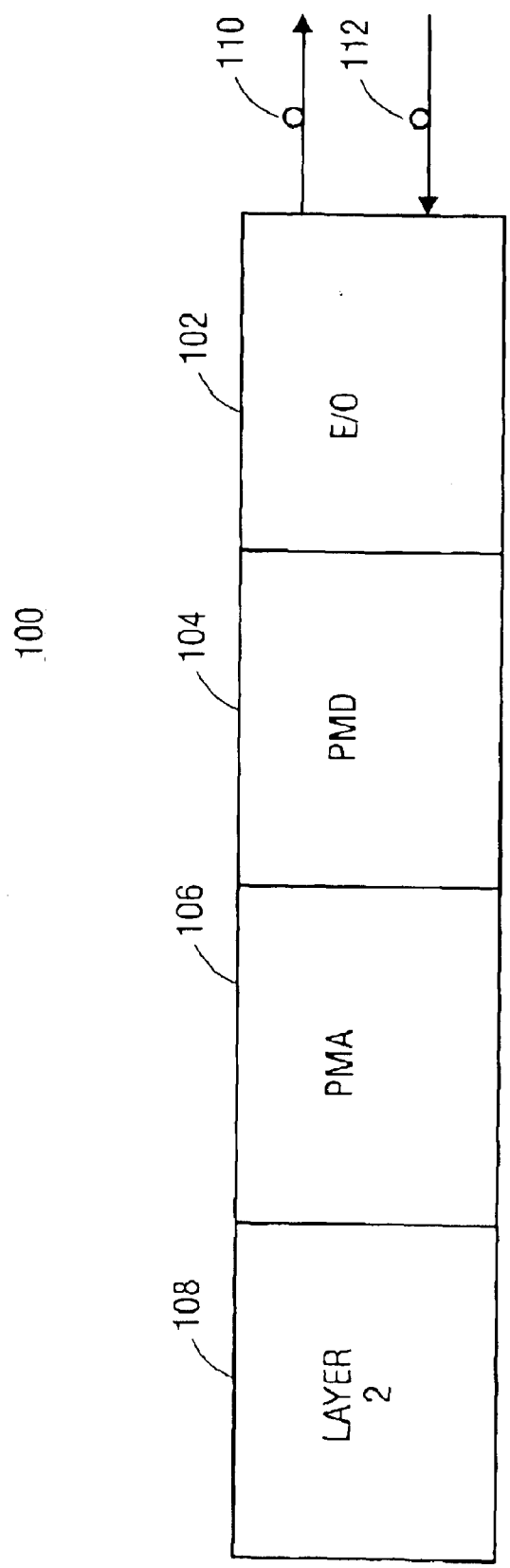
FIG. 1 shows a schematic diagram of a system to transmit data in and receive data from an optical transmission medium according to an embodiment of the present invention.

Reference throughout this specification to one embodiment or an embodiment means that a particular feature, structure, or characteristic described in connection with the embodiment is included in at least one embodiment of the present invention. Thus, the appearances of the phrase in one embodiment or an embodiment in various places throughout this specification are not necssarily all referring to the same embodiment. Furthermore, the particular features, structures, or characteristics may be combined in one or more embodiments.

A photodiode as referred to herein relates to a device that provides an output current in response to light energy collected on a surface. For example, a photodiode may provide an output current in response to charge collected at a photodiode gate. However, this is merely an example of a photodiode and embodiments of the present invention are not limited in this respect.

An amplifier as referred to herein relates to a device or circuit to convert an input signal to an amplified output signal. For example, an amplifier may provide an amplified output signal having a magnitude that is related to a magnitude of an input signal by an amplification gain. In another example, an amplifier may generate a voltage signal having a magnitude related by an amplification gain to a magnitude of either a current or voltage received as an input signal. However, these are merely examples of an amplifier and embodiments of the present invention are not limited in these respects.

A transimpedance amplifier (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in these respects.

A single-ended terminal as referred to herein relates to an electrical terminal to transmit or receive a single-ended signal. For example, single-ended terminal may receive a signal as an input signal. However, this is merely an example of a single-ended terminal and embodiments of the present invention are not limited in this respect.

Differential terminals as referred to herein relates to a pair of electrical terminals that may receive or transmit a differential signal. For example, differential terminals signal may express a signal as a voltage difference between the terminals. However, this is merely an example of differential terminals and embodiments of the present invention are not limited in this respect.

A DC signal component as referred to herein relates to a signal component in an electrical signal that is substantially constant over a time period. For example, such a DC signal component may be characterized as being a DC voltage component having a constant voltage over the time period or as being a DC current component having a constant DC current over the time period. However, these are merely examples of a DC signal component and embodiments of the present invention are not limited in these respects.

An AC signal component as referred to herein relates to a signal component in an electrical signal that fluctuates over a time period. For example, such an AC signal component may be characterized as being an AC voltage component having a voltage that fluctuates over the time period or as being an AC current component having a current that fluctuates over the time period. However, these are merely examples of an AC signal component and embodiments of the present invention are not limited in these respects.

A composite signal as referred to herein relates to a signal that may be characterized as having a plurality of signal components combined together. For example, a composite signal may comprise a DC signal component added to an AC signal component. However, this is merely an example of a composite signal and embodiments of the present invention are not limited in this respect.

DC signal removal circuit as referred to herein relates to a circuit to substantially remove all or a portion of a DC signal component from a composite signal. For example, a DC signal removal circuit may substantially remove all or a portion of a DC signal component from a composite signal having a DC signal component and an AC signal component, resulting in an isolated AC signal component. However, this is merely an example of a DC signal removal circuit and embodiments of the present invention are not limited in this respect.

Briefly, an embodiment of the present invention relates to circuit or system to provide an output signal in response to composite input signal comprising an AC signal component and a DC signal component. An amplifier may provide an amplified voltage signal in response to a voltage representative of the composite signal. A filter may provide a filtered voltage signal that is representative of a magnitude of the DC signal component in response to the amplified voltage signal. A DC signal removal circuit may substantially remove at least a portion of the DC signal component from an input terminal in response to the filtered voltage signal. However, this is merely an example embodiment and other embodiments of the present invention are not limited in this respect.

FIG. 1 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple lanes of data in the optical transmission medium.

A physical medium dependent (PMD) section 104 may provide circuitry, such as a TIA (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std.802.3ae-2002, clause 46. In other embodiments, the layer 2 section 108 may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices on a processing platform. Such an I/O system may include, for example, a multiplexed data bus coupled to a processing system or a multi-port switch fabric. The layer 2 section 108 may also be coupled to a multi-port switch fabric through a packet classification device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE Std. 802.3ae-2002, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 2:
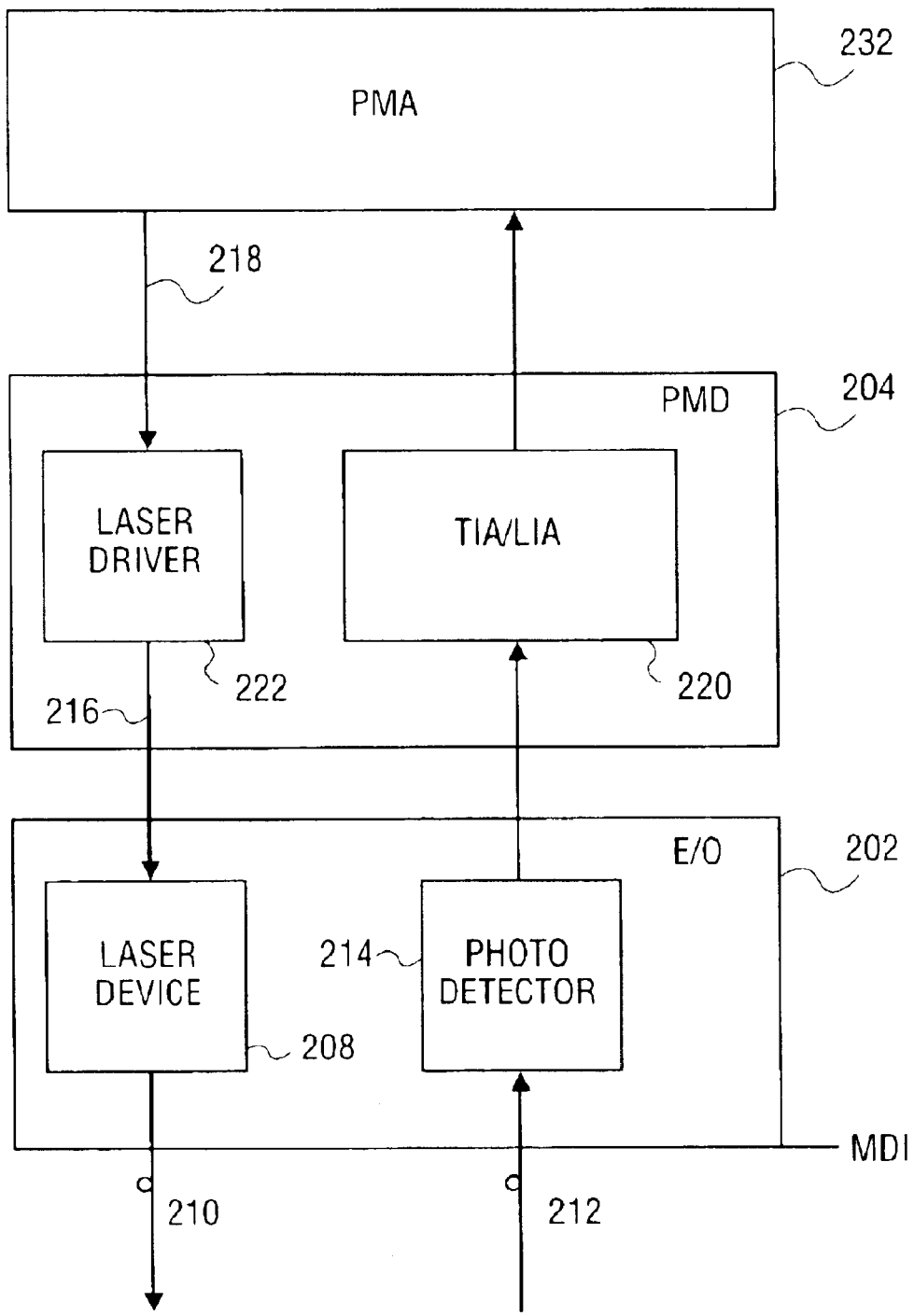
FIG. 2 shows a schematic diagram of physical medium attachment (PMA) and physical medium dependent (PMD) sections of a data transmission system according to an embodiment of the system shown in FIG. 2.

FIG. 2 shows a schematic diagram of a system 200 to transmit data in and receive data from an optical transmission medium according to an embodiment of the system shown in FIG. 2. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a transimpedance amplifier/limiting amplifier (TIA/LIA) circuit 220. A laser driver circuit 222 may modulate a modulation current 216 in response to a data signal from a PMA section 232. A laser device 208 may then modulate and power the transmitted optical signal 210 in response to the modulation current 216.

Figure 3:
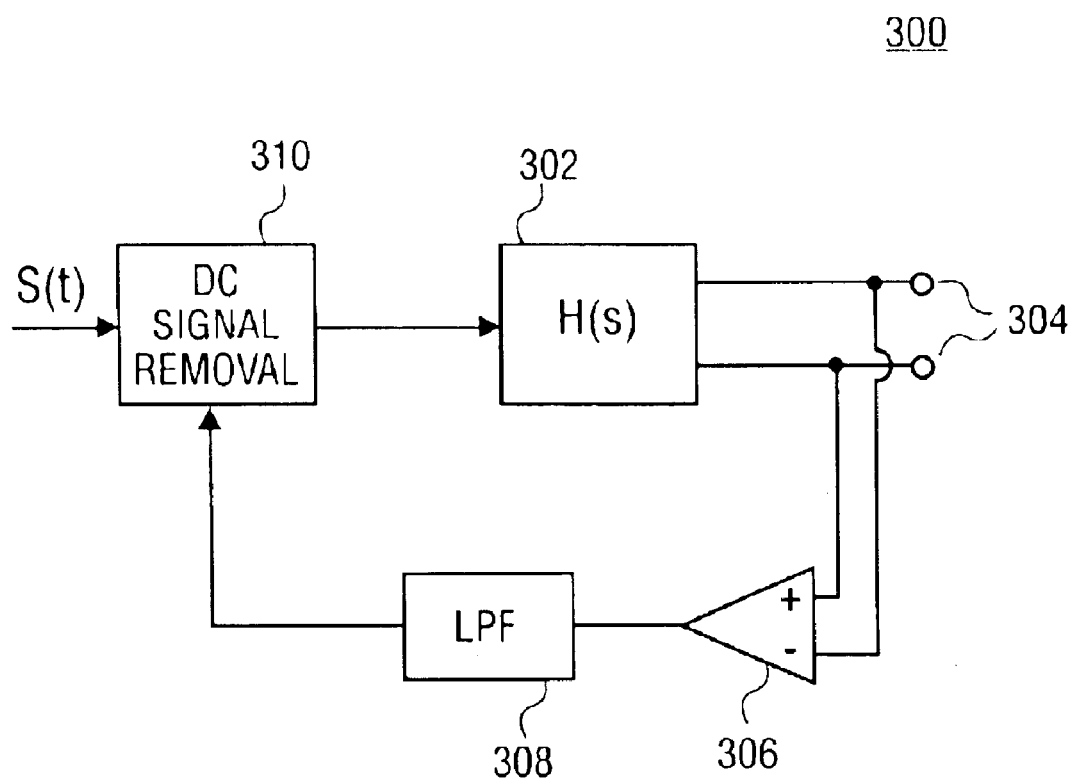
FIG. 3 shows a schematic diagram of a system to remove at least a portion of a DC signal component from an input signal according to an embodiment of the present invention.

According to an embodiment, the photo detector section 214 may provide a composite signal to the TIA/LIA circuit 220 comprising AC and DC signal components. For example, an input signal received at a TIA portion may comprise an AC current component and a DC current component while an input received at a LIA portion may comprise an AC voltage component and a DC voltage component. FIG. 3 shows system 300 to remove all or a portion of a DC signal component of an input according to an embodiment of either the TIA or LIA portion of the TIA/LIA circuit 220. An input signal s(t) comprises AC and DC signal components and a gain section 302 may provide a differential output signal at output terminals 304 in response to the input signal s(t).

According to an embodiment, an amplifier 306 receives a voltage signal which is representative of the AC and DC signal components of the input signal s(t). A low pass filter (LPF) 308 may receive the output of the amplifier 306 as an amplification of this voltage signal by a predetermined gain. The output of the LPF 308 may substantially remove an AC portion of the amplified voltage signal to provide a voltage signal that is substantially representative of a magnitude of the DC signal component of the input signal s(t). The LPF 308 may be formed from resistive and capacitive components or circuit elements using techniques known to those of ordinary skill in the art. Resistive and capacitive components may be selected to provide a pass band to transmit the voltage signal representative of the DC signal component and to substantially attenuate any component of the amplified voltage signal which is responsive to the AC signal component. In response to this filtered output of the LPF 308, a DC signal removal section 310 may remove substantially a portion or all of the DC signal component of the input signal s(t) so that the gain section 302 receives an isolated AC signal component of the input signal s(t).

According to an embodiment, the amplifier 306 may be formed as an operational amplifier using any one of several techniques known to those of ordinary skill in the art of analog circuit design. It should be understood that the amplifier 306 may add noise to the amplified voltage signal which is generated in response to the voltage signal received at the inputs of the amplifier 306. In addition to removing the AC portion of the amplified voltage signal, the LPF 308 may remove the noise added to the voltage signal to enhance the accuracy of the output voltage signal in representing the magnitude of the DC signal component of the input signal s(t). This may enable system designers to use noisier, less costly design for the amplifier 306 as the LPF 308 may remove noise added to the input signal. This may also enable designers to build a system with an enhanced sensitivity to optical signals received from the photo detector 214.

As discussed with reference to FIGS. 4 and 5, the system 300 may be implemented in either a TIA portion or LIA portion of the PMD 204 according to alternative embodiments of the present invention. However, it should be understood that the embodiments of the present invention in these implementations are merely example implementations, and that other embodiments may be implemented in other feedback systems that receive a composite input signal comprising DC and AC signal components.

Figure 4A:
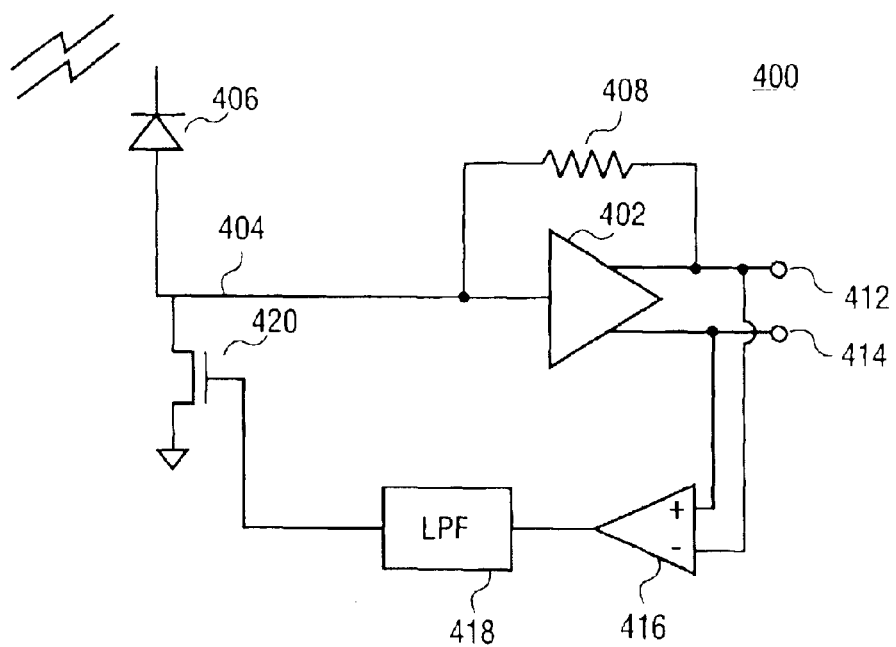
FIGS. 4A and 4B show schematic diagrams of a transimpedance amplifier (TIA) according to alternative embodiments of the PMD section shown in FIG. 2.
Figure 4B:
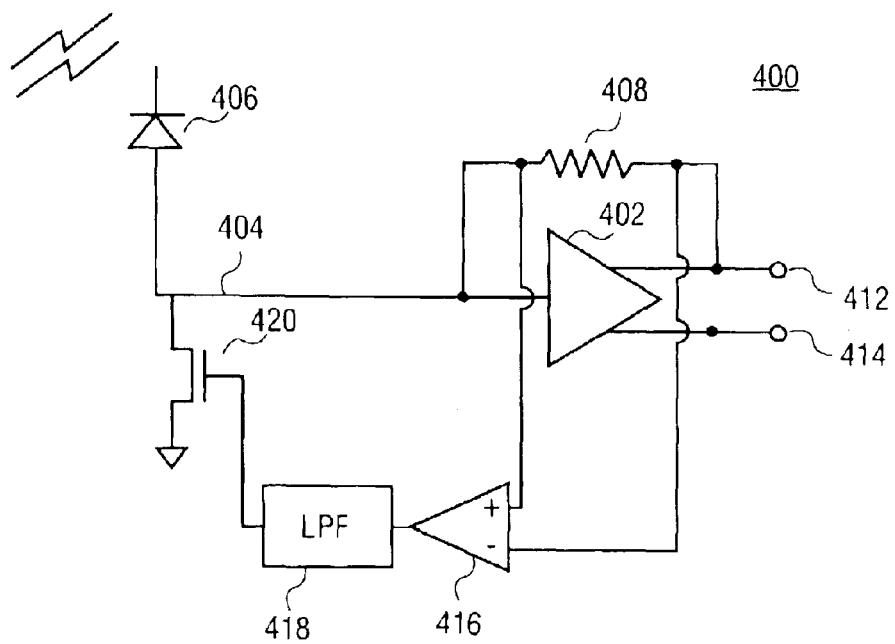

FIGS. 4A and 4B show a schematic diagrams of alternative embodiments of a TIA 400 according to an embodiment of the PMD section 204 shown in FIG. 2 incorporating a system to remove substantially all or a portion of a DC current component of an input signal according to an embodiment of the system 300 shown in FIG. 3. An amplifier 402 may receive a single-ended input 404 from a photodiode 406 which is responsive to an optical data signal and provides a differential output at output terminals 412 and 414. The TIA 400 may be formed as part of an integrated device (e.g., as part of a single device including the TIA 400 and other portions of the PMD section) in a semiconductor process such as a complementary metal oxide semiconductor (CMOS) manufacturing process. However, this is merely an example of a process that may be used to form a TIA and embodiments of the present invention are not limited in this respect.

Figure 5:
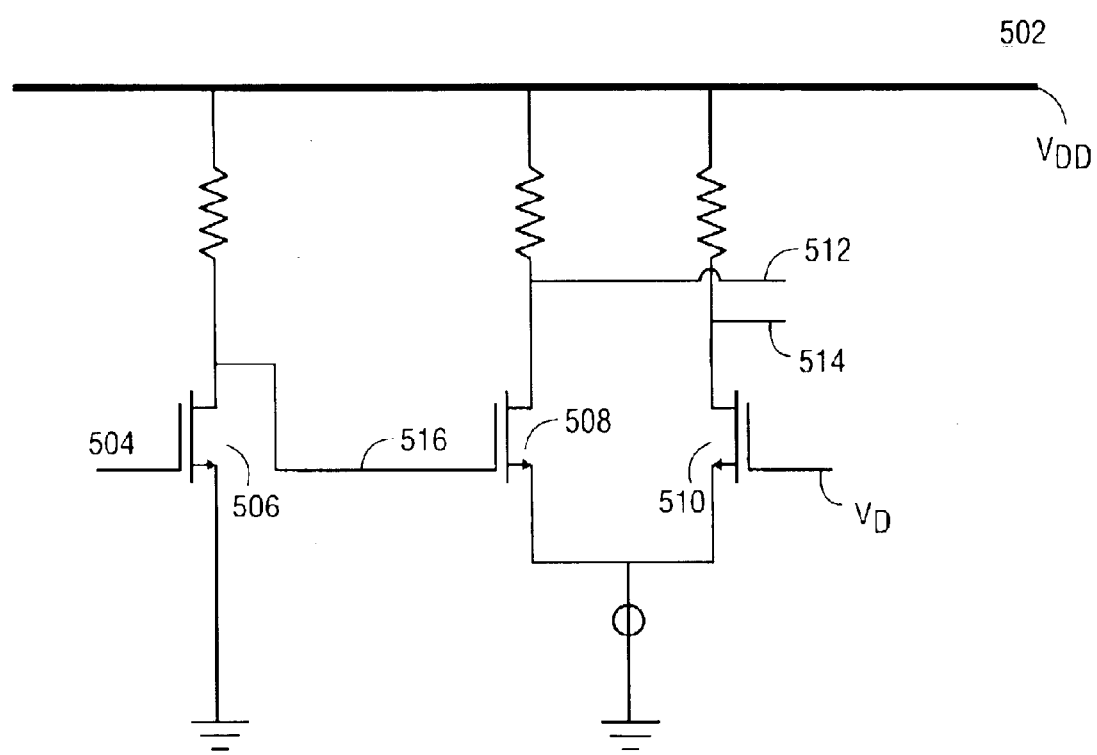
FIG. 5 shows a schematic diagram of a multistage amplifier according to an embodiment of a TIA shown in either FIG. 4A or 4B.

FIG. 5 shows a schematic diagram of an amplifier 502 according to an embodiment of the amplifier 402 shown in either FIG. 4A or 4B. A first amplification stage comprises a transistor 506. A gate of the transistor 506 may receive a single ended input signal on a single-ended input terminal 404 from the photodiode 406. In response to the input signal, a second amplification stage comprising a differential amplifier formed by transistors 508 and 510 may provide an output voltage on differential output terminals 512 and 514. However, this is merely an example of a multi-stage amplifier that may be implemented in a TIA and embodiments of the present invention are not limited in this respect.

According to an embodiment, the input signal 404 comprises an AC current component and a DC current component. In the embodiment of FIG. 4A, an amplifier 416 may comprise input terminals to receive a voltage from output terminals 412 and 414 which is representative of the magnitude of the composite AC and DC current components of the input signal 404. In the illustrated embodiment, the voltage from the output terminals 412 and 414 may have a magnitude that is substantially proportional to a magnitude of the composite AC and DC current component. An LPF 418 receives an output of the amplifier 416 comprising an amplification of the voltage from the output terminals 412 and 414. According to an embodiment, the LPF 418 may substantially remove a portion of the amplified voltage which is representative of the AC current component to isolate the portion of the amplified voltage which is representative of the DC current component The LPF 418 may also remove portions of noise added by the amplifier 416 in providing the amplified voltage. The output of the LPF 418 (comprising the isolated portion of the amplified voltage which is representative of the DC current component) may be provided to a sink transistor 420 to substantially remove all or a portion of the DC current component from the input signal 404.

In an alternative embodiment to detecting the composite signal from the output terminals 412 and 414, FIG. 4B shows that the amplifier 416 may provide a voltage representative of the composite signal from across a feedback resistor 408 as shown in FIG. 4B. The output terminal 412 provides feedback signal to the single-ended signal 404 through a resistor 408. An input voltage $V_{in}$ at the single-ended input 304 may be substantially proportional to an output voltage $V_{out}$ at an output terminal 412. The voltage across the resistor 408 may be substantially proportional to the magnitude of the current provided at the single-ended input 404. As such, the voltage across the resistor 408 may have a DC voltage component and an AC voltage component that are substantially proportional to the magnitudes of respective DC and AC current components of the input signal received at the single ended input 304. As discussed above with reference to the embodiment illustrated in FIG. 4A, the amplifier 416 may provide an amplified voltage signal to the LPF 418. In response, the LPF 418 may generate a voltage which is representative of an isolated DC current component of the input signal 404. The sink transistor 420 may then remove substantially all or a portion of the DC current component of the input signal 404 in response to voltage representative of the isolated DC current component received at the gate terminal.

By performing low pass filtering after the amplification at amplifier 416, much of the noise added by the amplifier 416 may be removed by the LPF 418. Accordingly, this may enable system designers to use noisier, less costly design for the amplifier 416 as the LPF 418 may remove noise added to the input signal. Additionally, low pass filtering at the output of LPF 418 may enable the use of a noisier, higher gain design for amplifier 416 to drive the sink transistor 420 for removing substantially all or a portion of a DC current component from the single-ended input terminal 404.

Figure 6:
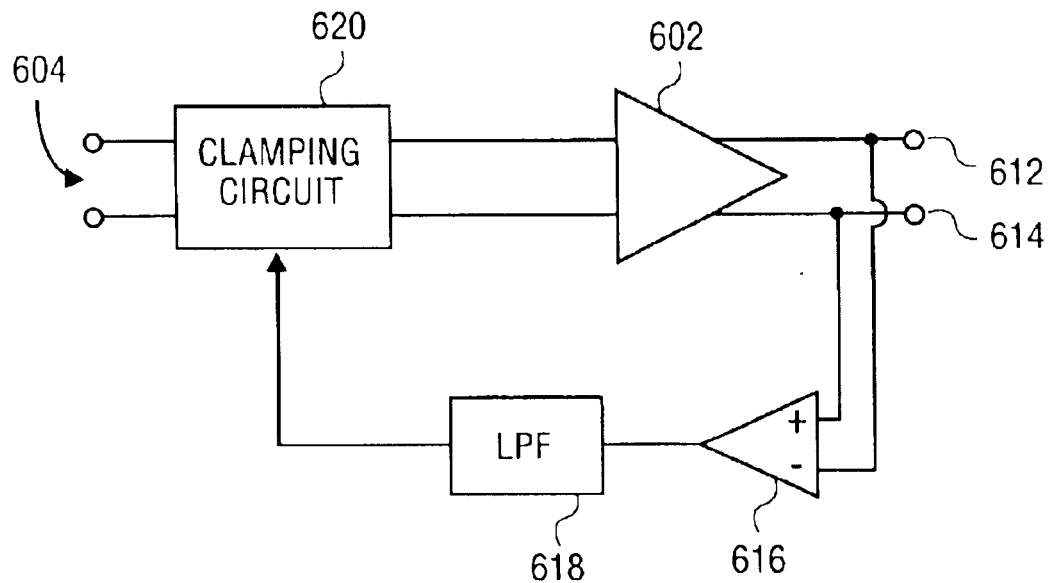
FIG. 6 shows a schematic diagram of a limiting amplifier (LIA) according to an embodiment of the PMD section shown in FIG. 2.

FIG. 6 shows a LIA 600 according to an embodiment of the TIA/LIA section 220 of the PMD 204 shown in FIG. 2. The LIA 600 may be formed as part of an integrated device (e.g., as part of a single device including the LIA 600 and other portions of the PMD section) in a semiconductor process such as a complementary metal oxide semiconductor (CMOS) manufacturing process. However, this is merely an example of a process that may be used to form a LIA and embodiments of the present invention are not limited in this respect.

A TIA (not shown) may provide a differential voltage as an input signal 604. In response to the input signal 604, an amplifier 602 may provide a differential output voltage at output terminals 612 and 614. According to an embodiment, the input signal 604 may be a composite signal comprising an AC voltage component and a DC voltage component. A clamping circuit 620 may remove substantially all or a portion of the DC voltage component from the input signal 604.

An amplifier 616 may receive the differential output voltage at as inputs to provide an amplified voltage signal comprising an AC voltage component and a DC voltage component as an output. An LPF 618 may remove substantially all of the AC voltage component from the amplified voltage signal to provide an isolated DC voltage component to the clamping circuit 620. In response to the isolated DC voltage component, the clamping circuit 620 may remove substantially all or a portion of the DC voltage component of the input signal 604.

Figure 7:
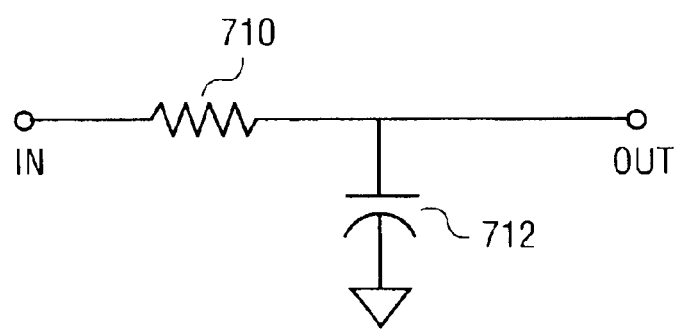
FIG. 7 shows a schematic diagram of a circuit for a low pass filter according to an embodiment.

FIG. 7 shows a schema tic diagram of a circuit for a low pass filter according to an embodiment of the present invention as illustrated with reference to FIGS. 3, 4A, 4B and 6. According to an embodiment, the LPFs 308, 418 and 618 may be any LPF formed using a resistor 710 and capacitor 712 as shown in FIG. 5. However, this is merely an example of how a LPF may be formed in a circuit and embodiments of the present invention are not limited in these respects.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive-concept described herein. Therefore, it is intended that the present invention not be limited to the particular embodiments disclosed, but that the invention include all embodiments falling within the scope of the appended claims.

What is claimed is:

1. A transimpedance amplifier comprising:
    a single ended input terminal to receive an input signal from a photodiode, the input signal comprising a composite signal comprising a DC current component and an AC current component;
    differential output terminals to provide an output signal in response to the input signal;
    a resistor coupled between the single ended input terminal and one of the differential output terminals;
    an amplifier to provide an amplified voltage signal in response to a voltage representative of the composite signal, the amplifier comprising input terminals coupled across the resistor to receive the voltage signal representative of the composite signal;
    a filter to provide a filtered voltage signal having a magnitude that is representative of a magnitude of the DC current component in response to the amplified voltage signal; and
    a DC current removal circuit coupled to the single ended input terminal to remove at least a portion of the DC current component from the input signal in response to the filtered voltage signal.

2. The transimpedance amplifier of claim 1, wherein the DC current removal circuit comprises a current sink transistor coupled to the single ended input terminal to remove a current from the input signal in response to the filtered voltage signal.

3. The transimpedance amplifier of claim 1, wherein the magnitude of the filtered voltage signal is substantially proportional to the magnitude of the DC current component.

4. A circuit comprising:
    an input terminal to receive a composite signal comprising an AC signal component and a DC signal component;
    differential output terminals to provide an output signal in response to the composite signal;
    a resistor coupled between the input terminal and one of the differential output terminals;
    an amplifier to provide an amplified voltage signal in response to a voltage representative of the composite signal, the amplifier comprising input terminals coupled across the resistor to receive the voltage signal representative of the composite signal;
    a filter to provide a filtered voltage signal having a magnitude that is representative of a magnitude of the DC signal component in response to the amplified voltage signal; and
    a DC signal removal circuit coupled to the input terminal to remove at least a portion of the DC signal component from the input terminal in response to the filtered voltage signal.

5. The circuit of claim 4, wherein the composite signal comprises an AC voltage component and a DC voltage component, and wherein the DC signal removal circuit comprises a DC voltage removal circuit coupled to the input terminal to substantially remove at least a portion of the DC voltage component from the input terminal.

6. The circuit of claim 5, wherein the input terminal provides an input terminal to a transimpedance amplifier and the differential output terminals provide an output of the transimpedance amplifier.

7. The circuit of claim 5, wherein the DC voltage removal circuit comprises a voltage clamp circuit.

8. The circuit of claim 4, wherein the composite signal comprises an AC current component and a DC current component, and wherein the DC signal removal circuit comprises a current removal circuit coupled to the input terminal to substantially remove at least a portion of the DC current component in response to the filtered voltage signal.

9. The circuit of claim 4, wherein the magnitude of the filtered voltage signal is substantially proportional to the magnitude of the DC signal component.

10. A system comprising:
    a photodiode;
    a transimpedance amplifier coupled to the photodiode to provide a differential output signal;
    a data recovery circuit to provide a serial data signal in response to the differential output signal;
    a deserializer to provide a parallel data signal in response to the serial data signal, wherein the transimpedance amplifier comprises:
    a single ended input terminal to receive an input signal from the photodiode, the input signal comprising a composite signal comprising a DC current component and an AC current component;

differential output terminals to provide the differential output signal;

a resistor coupled between the single ended input terminal and one of the differential output terminals;

an amplifier to provide an amplified voltage signal in response to a voltage representative of the composite signal, the amplifier comprising input terminals coupled across the resistor to receive the voltage signal representative of the composite signal;

a filter to provide a filtered voltage signal having a magnitude that is representative of a magnitude of the DC current component in response to the amplified voltage signal; and a DC current removal circuit coupled to the single ended input terminal to remove at least a portion of the DC current component from the input signal In response to the filtered voltage signal.

11. The system of claim 10, the system further comprising a SONET framer to receive the parallel data signal.

12. The system of claim 10, wherein the system further comprises a switch fabric coupled to the SONET framer.

13. The system of claim 10, the system further comprising an Ethernet MAC to receive the parallel data signal at a media independent interface.

14. The system of claim 13, wherein the system further comprises a multiplexed data bus coupled to the Ethernet MAC.

15. The system of claim 13, wherein the system further comprises a switch fabric coupled to the Ethernet MAC.

16. A method comprising:

receiving an input signal from a photodiode at an input terminal, the input signal comprising a composite signal comprising a DC current component and an AC current component;

providing a differential output signal on differential output terminals in response to the input signal;

amplifying a voltage representative of the composite signal to provide an amplified voltage signal, the voltage representative of the composite signal being a voltage across a resister coupled between the Input signal and one of the differential output terminals;

filtering the amplified voltage signal to provide a filtered voltage signal having a magnitude that is representative of a magnitude of the DC current component; and removing at least a portion of the DC current component from the input signal in response to the filtered output voltage signal.

17. The method of claim 16, wherein substantially removing at least a portion of the DC current component from the input signal further comprises applying the filtered voltage signal to a gate of a current sink transistor coupled to the single ended input terminal.

18. The method of claim 16, wherein the magnitude of the filtered voltage signal is substantially proportional to the magnitude of the DC current component.

19. A method comprising:

receiving a composite signal comprising an AC signal component and a DC signal component at an input terminal;

providing a differential output signal on differential output terminals in response to the input signal;

amplifying a voltage representative of the composite signal to provide an amplified voltage signal, the voltage representative of the composite signal being a voltage across a resister coupled between the input signal and one of the differential output terminals;

filtering the amplified voltage signal to provide a filtered voltage signal having a magnitude that is representative of a magnitude of the DC signal component; and removing at least a portion of the DC signal component from the input terminal in response to the filtered voltage signal.

20. The method of claim 19, wherein the composite signal comprises an AC voltage component and a DC voltage component, and wherein substantially removing at least a portion of the DC signal component from the input terminal further comprises substantially removing at least a portion of the DC voltage component from the input terminal in response to the filtered voltage signal.

21. The method of claim 20, wherein substantially removing at least a portion of the DC voltage component further comprises applying the filtered voltage signal as an input to a voltage clamp circuit coupled to the input terminal.

22. The method of claim 19, wherein the composite signal comprises an AC current component and a DC current component, and wherein substantially removing at least a portion of the DC signal component further comprises substantially removing at least a portion of the DC current component from the input signal in response to the filtered voltage signal.

23. The method of claim 22, wherein substantially removing at least a portion of the DC current further comprises applying the filtered voltage signal to a gate terminal of a sink transistor coupled to the input terminal.

24. The method of claim 19, wherein the magnitude of the filtered voltage signal is substantially proportional to the magnitude of the DC signal component.

25. The system of claim 10, wherein the DC current removal circuit comprises a current sink transistor coupled to the single ended input terminal to remove a current from the input signal in response to the filtered voltage signal.

26. The system of claim 10, wherein the magnitude of the filtered voltage signal is substantially proportional to the magnitude of the DC current component.

* * * * *